(12) United States Patent
Kusumi

(10) Patent No.: US 6,360,354 B1
(45) Date of Patent: Mar. 19, 2002

(54) AUTOMATIC ARRANGEMENT OF WIRING PATTERNS IN SEMICONDUCTOR DEVICE

(75) Inventor: Takeo Kusumi, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/175,273

(22) Filed: Oct. 20, 1998

(30) Foreign Application Priority Data

Nov. 4, 1997 (JP) .............................................. 9-301635

(51) Int. Cl.$^7$ .............................................. G06F 17/50
(52) U.S. Cl. ...................................................... 716/12
(58) Field of Search .............................. 716/2, 8, 12, 13

(56) References Cited

U.S. PATENT DOCUMENTS 5,475,608 A * 12/1995 Masuoka ....................... 716/8
6,006,204 A * 12/1999 Guruswamy .................. 716/8

FOREIGN PATENT DOCUMENTS

| JP | 59-149032 | 8/1984 |
| JP | 60-30151 | 2/1985 |
| JP | 63-248144 | 10/1988 |
| JP | 5-267454 | 10/1993 |
| JP | 7-37981 | 2/1995 |

\* cited by examiner

*Primary Examiner*—Matthew Smith
*Assistant Examiner*—Thuan Do
(74) *Attorney, Agent, or Firm*—Scully, Scott, Murphy & Presser

(57) ABSTRACT

A method of producing a core for a semiconductor device, includes the step of providing a virtual block, which has a contact to be connected to an external wiring line of an external circuit outside the core. Also, the method of producing a core for a semiconductor device, includes the step of setting a wiring prohibition region in the virtual block. The connection of an internal wiring line arranged inside the core to the contact is prohibited in the wiring prohibition region. Further, the method of producing a core for a semiconductor device includes the step of arranging at least the contact of the virtual block inside the core.

28 Claims, 11 Drawing Sheets

AUTOMATIC ARRANGEMENT OF WIRING PATTERNS IN SEMICONDUCTOR DEVICE

BACKGROUND OF THE INVENTION

1. Field of the Invention

The present invention generally relates to an automatic arrangement of wiring patterns in semiconductor device. More specifically, the present invention is directed to an automatic arrangement of wiring patterns in semiconductor device in high integration while omitting step of confirming interference occurred in wiring patterns inside and outside function blocks.

2. Description of the Related Art

As known in the method of automatically arranging and wiring patterns of semiconductor device, function blocks are called as "hardware-based cores", or "cores" simply, and these cores are arranged in a semiconductor device such as a gate array. A core is designed by a combination of function cells and a primitive made of a plurality of function cells. In connection with multi-functions of a core, very recently, a total number of terminals of the core is increased. The total number of terminals may mainly influence the size of the core. Function blocks of a semiconductor device are arranged and wired by utilizing a computer.

Referring now to the drawings, a conventional automatic arranging and wiring method of a semiconductor device containing a core (related art 1) will be described. FIG. 1 is a flow chart for describing the conventional automatic arranging and wiring method as the related art 1. FIG. 2A is a plan view for representing setting of a boundary line of a core in accordance with the related art 1 of FIG. 1. FIG. 2B is an enlarged plan view for showing the vicinity of the boundary line (inside circle) of the core indicated in FIG. 2A. Also, FIG. 3 is a plan view for representing the core arranging and wiring patterns, corresponding to FIG. 2A, formed by the conventional arranging and wiring method as the related art 1.

Referring now to the flow chart of FIG. 1, the automatic arranging and wiring method of the related art 1 will be explained.

At a step S20, an optimum size of a core is set based upon a circuit scale of the core. As indicated in FIG. 2A, a boundary line 12 is set for a region (an automatic layout region) where an automatic layout process is performed to a cell array region 11.

Next, at a step S21, a function cell 18 inside the core is an interface with an external circuit outside the core. The function cell 18 is arranged inside the automatic layout region set at the step S20 such that the function cell (the interface function cell) 18 is located adjacent to the boundary line 12.

In this case, this is because the designing flexibility of internal wiring lines (corresponding to wiring lines indicated by reference numeral 17 shown in FIG. 3) arranged in the core is increased, when the internal wiring lines are automatically designed by using a computer.

Subsequently, at a step S22, the internal wiring lines 17 are automatically arranged and wired by using an automatic arranging and wiring program in which data related to the plurality of interface function cells 18 has been entered. At this time, as indicated in FIG. 3, each of the internal wiring lines 17 is connected to the plurality of interface function cells 18.

Next, at a step S23, with reference to the automatic arranging and wiring result of the core formed at the step S22, a judgment is made whether or not a wiring line region "K" is reserved between the boundary line 12 and all of the terminals 19 of the interface function cells 18. In this case, the wiring line region "K" is used to arrange wiring lines (external wiring lines, not shown in detail) connected to external circuits outside the core. In other words, a confirmation is made that any of the internal wiring lines 17 are not present between the terminals 19 and the boundary line 12.

When it is so judged that the wiring line region K is not reserved between all of the terminals 19 of the interface function cells 18 and the boundary line 12, the automatic arranging and wiring operation of the core corresponding to the step S22 is again performed. Otherwise, the automatic arranging and wiring result of the core generated at the step S22 is manually corrected.

If the result of the judgment at the step S23 is desired, then the judged automatic arranging and wiring result is outputted as layout data. It should be understood that since, in FIG. 3, the wiring region K is reserved between all of the terminals 19 and the boundary line 12, FIG. 3 schematically represents this automatic arranging and wiring result judged as a "desired" result at the step S23.

As a consequence, the terminals 19 corresponding to the automatic arranging and wiring result outputted as the layout data can be terminals which are directly connectable with the external wiring lines without causing shortcircuits with the internal wiring lines 17.

However, in the above-described related art 1, in case that the wiring region K near the boundary line 12 cannot be reserved, the automatic arranging and wiring operation must be repeatedly performed. Otherwise, the correcting work is required, resulting in lowering of the design efficiency.

To avoid this problem, another related art about automatic arranging and wiring method has been proposed with using a virtual block as a terminal portion of a core.

This conventional designing method (namely, related art 2) will now be explained with reference to FIG. 4 to FIG. 7. FIG. 4 is a flow chart for describing the conventional automatic arranging and wiring method as the related art 2.

FIG. 5A is a plan view for representing setting of the boundary line of the core in the related art 2, similar to FIG. 2A. FIG. 5B is an enlarged plan view for showing the vicinity of the boundary line of the core indicated in FIG. 5A, similar to FIG. 2B. FIG. 6 is a plan view for representing a layout formed by the conventional arranging and wiring method as the related art 2, similar to FIG. 3. FIG. 7A is a schematic circuit diagram for indicating a subject circuit for the conventional automatic arranging and wiring method of FIG. 4. FIG. 7B is a circuit diagram formed by inserting a virtual block into the schematic circuit diagram shown in FIG. 7A.

As indicated in FIG. 4 and FIG. 7A, at a first step S25 of FIG. 4, a position of an external terminal 8 outside a core is predicted, and a virtual block 32 is inserted between this predicted external terminal 8 and a function cell 28 to be an interface of the core. This condition is indicated in FIG. 7B. In FIG. 7A and FIG. 7B, symbol "H" indicates a group of function cells arranged inside a boundary line 12 of the core except for the plurality of function cells 28.

At a next step S26, a position of a terminal 31 of the virtual block 32 is determined.

At a next step S27, an optimum size of the core is determined based upon a circuit scale of the core, and the boundary line 12 which marks a region for an automatic layout is set, as shown in FIG. 5A.

Next, at a step S28, the virtual block 32 shown in FIG. 5B is arranged adjacent to the boundary line 12 of the core. In this case, a size of this virtual block 32 is defined based upon a single cell of a minimum unit cell (corresponding to a minimum rectangular shape surrounded by a broken line in FIG. 5B) in the core. The terminal 31 of the virtual block 32 is set within the virtual block 32.

At a next step S29, an operation of automatically arranging and wiring internal wiring lines 17 of the core is performed by utilizing an automatic arranging and wiring program in which the condition defined at the step S28 is entered.

At a further step S30, the automatic arranging and wiring result of the core formed at the step S29 is outputted as layout data of the core shown in FIG. 6. As a consequence, the terminal 31 connected to the internal wiring line 17 becomes a terminal to be an interface of the core.

Different from the first-mentioned related art 1, the second related art 2 has the following merits. The region where no virtual block 32 is provided is present in a region located adjacent to the boundary line 12, and this region can be effectively used. As a result, the resultant core can be made more compact than that realized by the related art 1.

However, the conventional automatic arranging and wiring methods still have such a drawback that a layout area needed for arranging and wiring the function cells of the core is increased.

In other words, the automatic arranging and wiring method of the related art 1 has not only the above-explained drawback, namely the repetition of layout designing, but also the following drawback. That is, as shown in FIG. 2B, all of the interface function cells 18 are arranged adjacent to the boundary line 12 of the core. Since all of the interface function cells 18 are concentrated to the outermost portion of the core, the peripheral length of the core is extended. As a result, the dimension of the core is increased and an occupied area by the core is increased.

Also, in the automatic arranging and wiring method of the related art 2, since the virtual block 32 is occupies as a portion of the core, the occupied area by the core is similarly increased.

In order to solve the above-explained drawback, the following solution may be conceived in the automatic arranging and wiring method of the related art 1. That is, the interface function cells 18 are arranged not only at the position adjacent to the boundary line 12, but also inside the boundary line 12. However, when this alternative structure is employed, the internal wiring lines 17 of the core are concentrated in the inner side of the boundary line 12 such that the wiring region K cannot be reserved, and therefore the repetitions of the layout designing works are increased.

Japanese Laid Open Patent Application, (JPA-Heisei 5-267454) discloses the below-mentioned pattern data producing method for the core. This pattern data producing method is comprised of the following steps (a) to (f). At the step (a), the virtual terminal position Ts is set to the grid position G fitted to the technology of the chip 19 to be mounted with respect to the terminal position Ta of the core pattern 20 outside the core pattern 20 formed by another technology, which does not depend upon the technology for the chip 19. At the step (b), the wiring pattern La is formed which connects the terminals Ta and Ts each other. At the step (c), a new terminal position Tn is set to the grid position G fitted to the technology for the chip 19 with respect to the virtual position Ts. At the step (d), the wiring pattern Ln is formed which connects the virtual terminal position Ts to the new terminal position Tn. At the step (e), the above-described wiring patterns La and Ln are added to the core pattern 20 to form the new pattern data. At the step (f), this newly added pattern data is used as the pattern data P of the new core fitted to the technology for the chip 19 to be mounted.

However, this conventional pattern data producing method of the core merely contributes shortening of the automatic layout processing time, but cannot solve the above-explained problems belonging to the related art 1 and also the related art 2.

SUMMARY OF THE INVENTION

The present invention is made to solve the above-described problems in the related arts as mentioned above.

An object of the present invention is to provide a semiconductor device arranging and wiring method, and also a semiconductor device arranging and wiring apparatus which can omit the step of confirming interference occurred in wiring patterns inside/outside function blocks.

Another object of the present invention is to provide a semiconductor device arranging and wiring method, and also a semiconductor device arranging and wiring apparatus in which a region used to arrange external wiring lines connected to external circuits outside a core can be reserved between the boundary line of the core and the terminal of the interface function cell, automatically.

Still another object is to provide a semiconductor device arranging and wiring method, and also a semiconductor device arranging and wiring apparatus in which can avoid a repetition of a layout designing work.

Further another object is to provide a semiconductor device arranging and wiring method, and also a semiconductor device arranging and wiring apparatus in which the problem can be solved that a layout area needed for arranging/wiring the function cells of the core is increased.

Yet still another object is to provide a semiconductor device arranging and wiring method, and also a semiconductor device arranging and wiring apparatus in which the problem can be solved that the dimension of the core is increased.

In order to achieve an aspect of the present invention, a method of producing a core for a semiconductor device includes the steps of providing a virtual block, which has a contact to be connected to an external wiring line of an external circuit outside the core, setting a wiring prohibition region in the virtual block, connection of an internal wiring line arranged inside the core to the contact being prohibited in the wiring prohibition region and arranging at least the contact of the virtual block inside the core.

In this case, the step of setting the wiring prohibition region includes setting the wiring prohibition region to have a substantially U-shaped contour, and to be opened along one direction of an omnidirectional direction outside the contact.

Also, the method of producing the core further includes the step of automatically arranging and wiring the core containing the contact to produce layout data of the core.

Further, the method of producing the core further includes the step of deleting data corresponding to the virtual block from the layout data to produce arranging and wiring data of the core.

In this case, the step of producing the layout data includes executing an automatic arranging and wiring operation of the core based upon circuit data indicative of a circuit specification of the semiconductor device, and the circuit data contains data indicative of the virtual block.

In order to achieve another aspect of the present invention, the step of producing the layout data includes executing an automatic arranging and wiring operation of the core such that the internal wiring line does not pass through the wiring prohibition region.

In order to achieve still another aspect of the invention, a method of producing a core which constitutes a semiconductor device, includes the steps of setting a boundary line of the core, providing a virtual block, setting a contact to the virtual block, the contact being used to be connected to an external wiring line of external circuit outside the core, and arranging the virtual block such that the contact is arranged inside the boundary line and on a position adjacent to the boundary line.

In this case, the step of setting the contact includes setting the contact in an edge portion of the virtual block.

Also, the step of providing the virtual block includes providing the virtual block to have a dimension equal to that of a single cell corresponding to a minimum unit of a function cell for constituting the core.

Further, the method of producing the core further includes the step of automatically arranging and wiring the core containing the contact to produce layout data of the core.

In this case, the method of producing the core further includes the step of deleting data corresponding to the virtual block from the layout data to produce arranging and wiring data of the core.

Also, the step of producing the layout data may include executing an automatic arranging and wiring operation of the core based upon circuit data indicative of a circuit specification of the semiconductor device, and the circuit data contains data indicative of the virtual block.

Further, the circuit data may contain data indicating that the virtual block has a dimension of a single cell corresponding to a minimum unit of a function cell for constituting the core.

In this case, the step of producing the layout data may include executing an automatic arranging and wiring operation of the core such that the internal wiring line does not pass through a region provided between the boundary line and the contact.

In order to achieve still another aspect of the present invention, a method of producing a core for a semiconductor device includes the step of setting a boundary line of the core, providing a virtual block, which has a contact to be connected to an external wiring line of an external circuit outside the core, setting a wiring prohibition region in the virtual block, connection of an internal wiring line arranged inside the core to the contact being prohibited in the wiring prohibition region, and arranging the virtual block such that the contact is arranged inside the boundary line, and on a position adjacent to the boundary line.

In order to achieve yet still another aspect of the present invention, a semiconductor device producing apparatus for producing a core for a semiconductor device includes unit for providing a virtual block, which has a contact to be connected to an external wiring line of an external circuit outside the core, unit for setting a wiring prohibition region in the virtual block, connection of an internal wiring line arranged inside the core to the contact being prohibited in the wiring prohibition region, and unit for arranging at least the contact of the virtual block inside the core.

In this case, the unit for setting the wiring prohibition region sets the wiring prohibition region to have a substantially U-shaped contour, and to be opened along one direction of an omnidirectional direction outside the contact.

Also, in this case, the semiconductor device producing apparatus, further includes unit for automatically arranging and wiring the core containing the contact to produce layout data of the core.

Further, the semiconductor device producing apparatus further includes unit for deleting data corresponding to the virtual block from the layout data to produce arranging and wiring data of the core.

In this case, the unit for producing the layout data executes an automatic arranging and wiring operation of the core based upon circuit data indicative of a circuit specification of the semiconductor device, and the circuit data contains data indicative of the virtual block.

Also, the unit for producing the layout data executes an automatic arranging and wiring operation such that the internal wiring line does not pass through the wiring prohibition region.

In this case, the unit for arranging the virtual block arranges the virtual block on a position corresponding to an external contact formed in the external circuit and used to be connected with the contact.

Also, the unit for arranging the virtual block arranges the virtual block between an external contact formed in the external circuit and used to be connected with the contact, and a function cell to be an interface of the core as a part of the core.

In order to achieve another aspect of the present invention, a semiconductor device producing apparatus for producing a core for a semiconductor device, includes unit for setting a boundary line of the core, unit for providing a virtual block, unit for setting a contact to the virtual block, wherein the contact is used to be connected to an external wiring line of an external circuit outside the core, and unit for arranging the virtual block such that the contact is arranged inside the boundary line and on a position adjacent to the boundary line.

In order to achieve still another aspect of the present invention, the unit for setting the contact sets the contact in an edge portion of the virtual block.

In this case, the unit for providing the virtual block provides the virtual block to have a dimension equal to that of a single cell corresponding to a minimum unit of a function cell for constituting the core.

Also, the semiconductor device producing apparatus, further includes unit for automatically arranging and wiring the core containing the contact to produce layout data of the core.

Further, the semiconductor device producing apparatus, further includes unit for deleting data corresponding to the virtual block from the layout data to produce arranging and wiring data of the core.

In this case, the unit for producing the layout data executes an automatic arranging and wiring operation of the core based upon circuit data indicative of a circuit specification of the semiconductor device, and the circuit data contains data indicative of the virtual block.

Also, the circuit data contains data indicating that the virtual block has a dimension equal to that of a single cell corresponding to a minimum unit of a function cell for constituting the core.

Further, the unit for producing the layout data executes an automatic arranging and wiring operation of the core such that an internal wiring line arranged inside the core does not pass through a region provided between the boundary line and the contact.

In this case, the unit for arranging the virtual block arranges the virtual block on a position corresponding to an external contact formed in the external circuit and used to be connected with the contact.

Also, the unit for arranging the virtual block arranges the virtual block between an external contact formed in the external circuit and used to be connected with the contact, and a function cell to be an interface of the core as a part of the core.

In order to achieve further another aspect of the present invention, a semiconductor device producing apparatus for producing a core for a semiconductor device, includes unit for setting a boundary line of the core, unit for providing a virtual block, which has a contact to be connected to an external wiring line of an external circuit outside the core, unit for setting a wiring prohibition region in the virtual block, connection of an internal wiring line arranged inside the core to the contact being prohibited in the wiring prohibition region, and unit for arranging the virtual block such that the contact is arranged inside the boundary line and on a position adjacent to the boundary line.

BRIEF DESCRIPTION OF THE DRAWINGS

A more complete understanding of the teachings of the present invention may be acquired by referring to the accompanying figures, in which like reference numbers indicate like features and wherein.

DESCRIPTION OF THE PREFERRED EMBODIMENTS

Referring now to drawings, various preferred embodiments of the present invention will be described.

Figure 1:
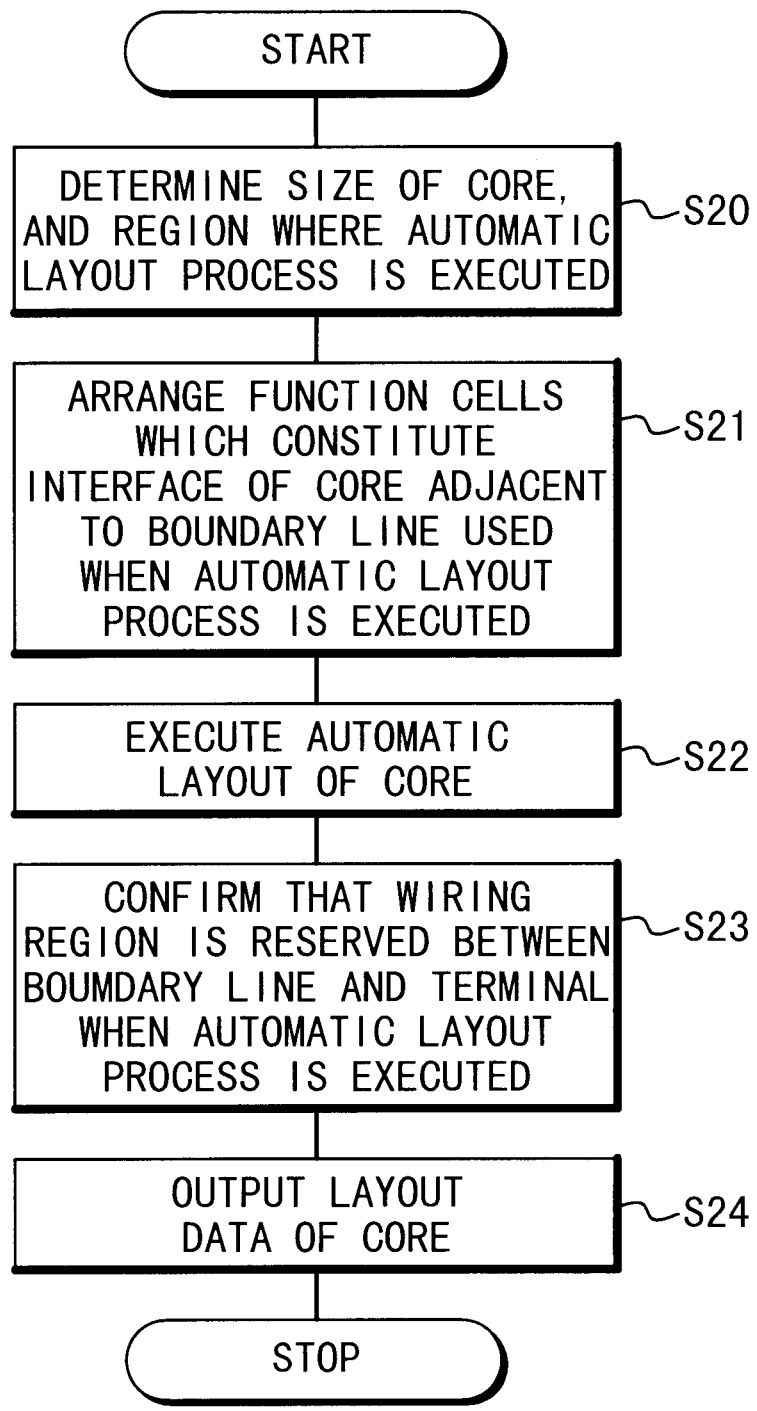
FIG. 1 is a flow chart for describing the conventional automatic arranging and wiring method as related art 1.
Figure 2A:
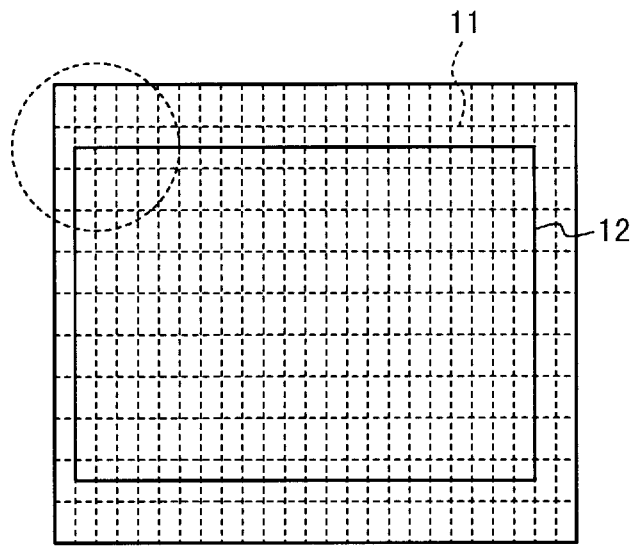
FIG. 2A is a plan view for representing setting of the boundary line of the core in accordance with the related art 1 of FIG. 1.
Figure 2B:
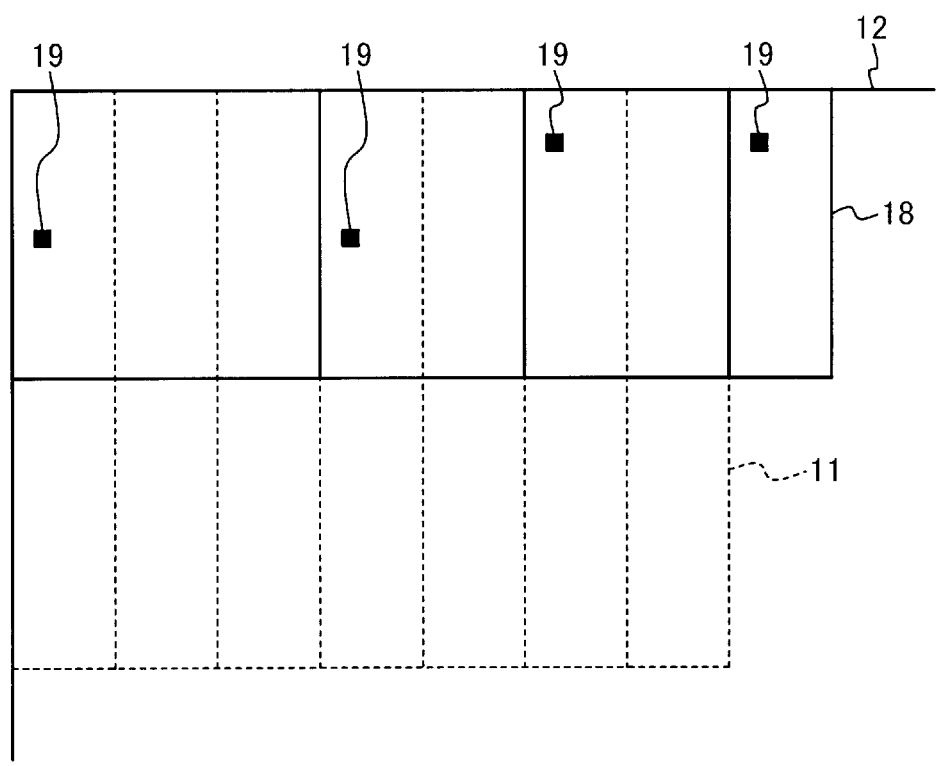
FIG. 2B is an enlarged plan view for showing the vicinity of the boundary line (inside circle) of the core indicated in FIG. 2A.
Figure 3:
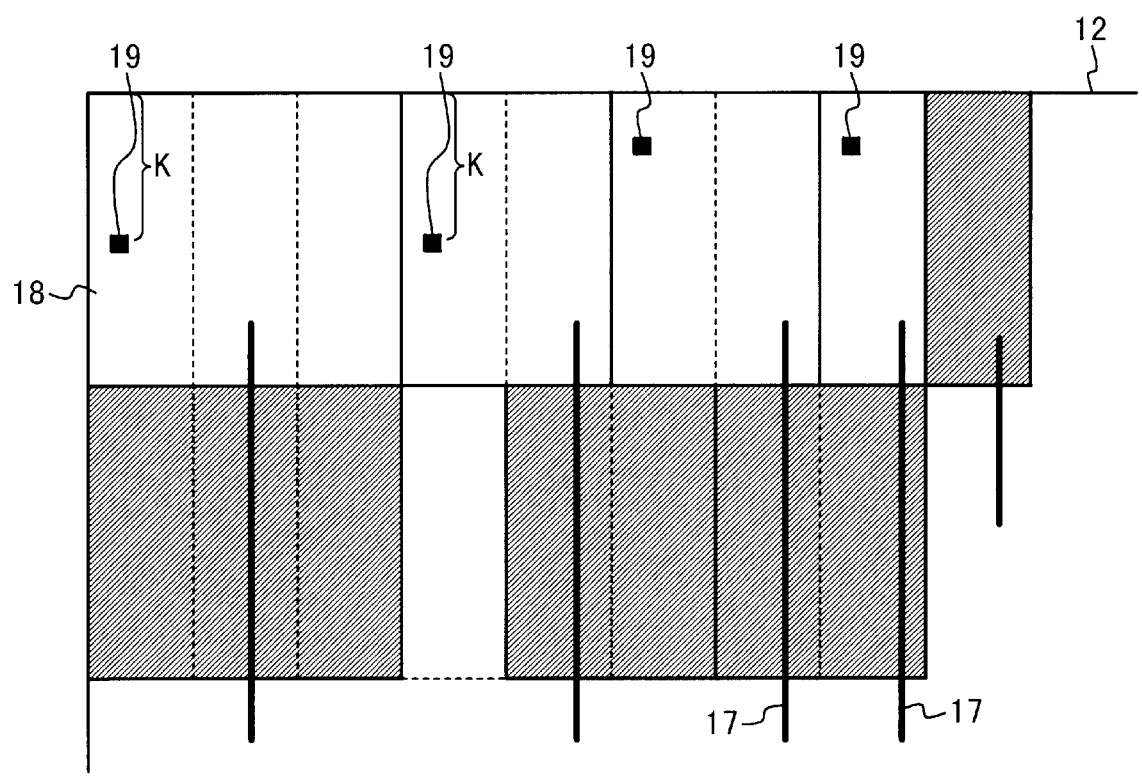
FIG. 3 is a plan view for representing the core arranging and wiring patterns formed by the conventional arranging and wiring method as the related art 1.
Figure 4:
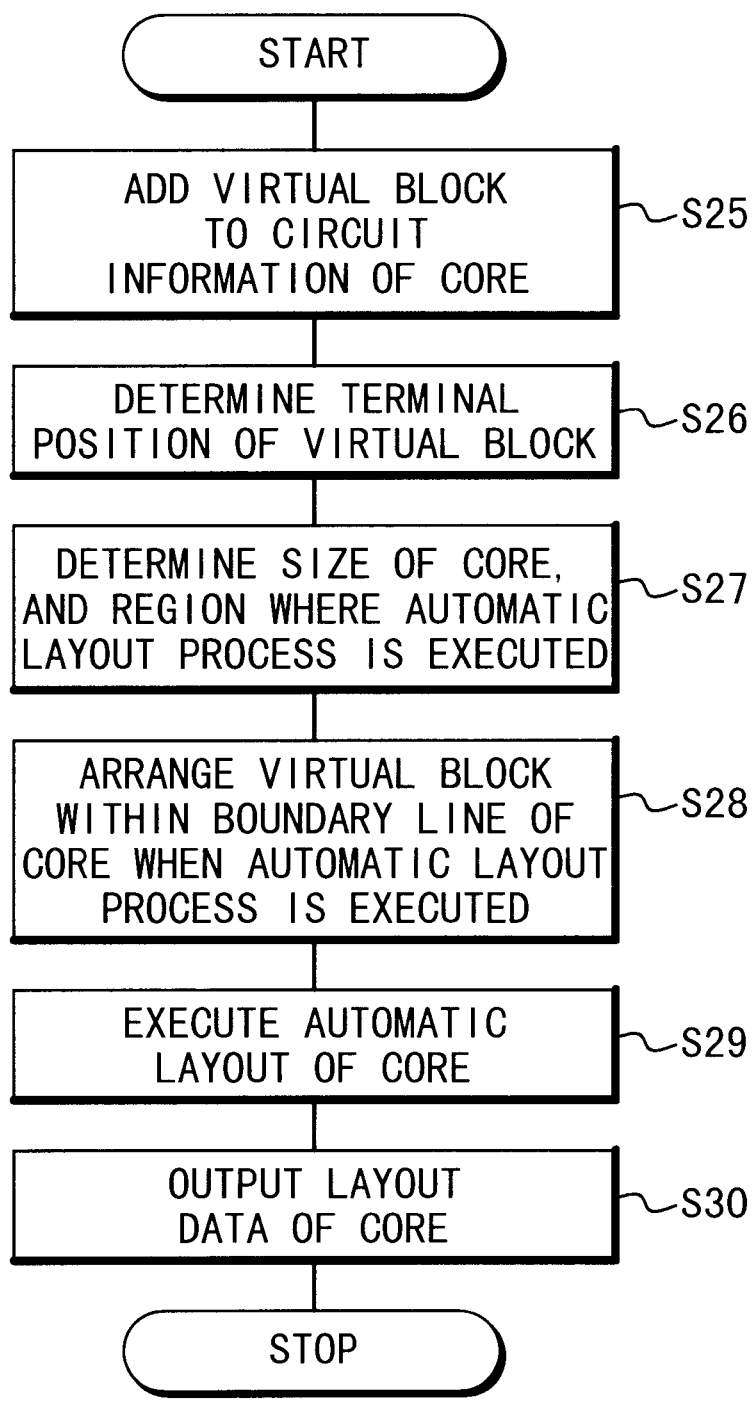
FIG. 4 is a flow chart for describing the conventional automatic arranging and wiring method as the related art 2.
Figure 5A:
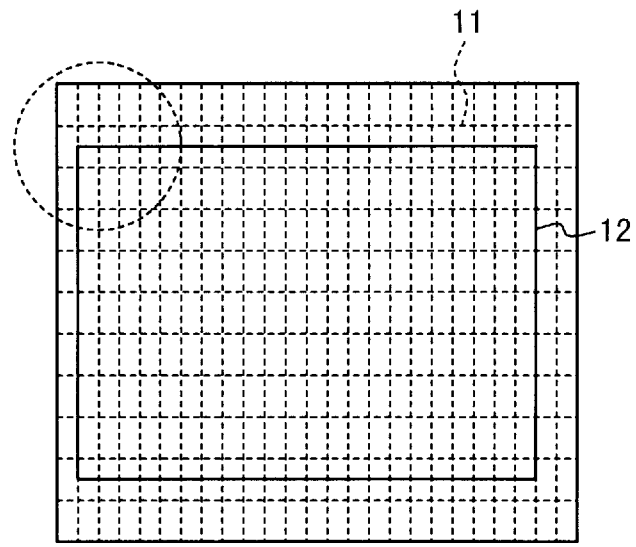
FIG. 5A is a plan view for representing setting of the boundary line of the core in accordance with the related art 2 of FIG. 4.
Figure 5B:
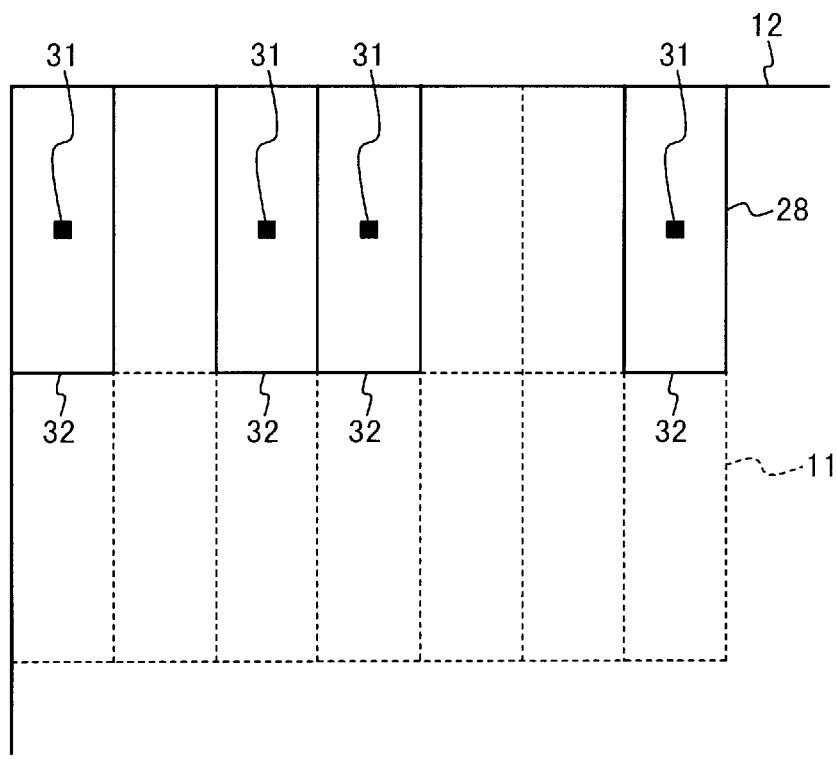
FIG. 5B is an enlarged plan view for showing the vicinity of the boundary line of the core indicated in FIG. 5A.
Figure 8:
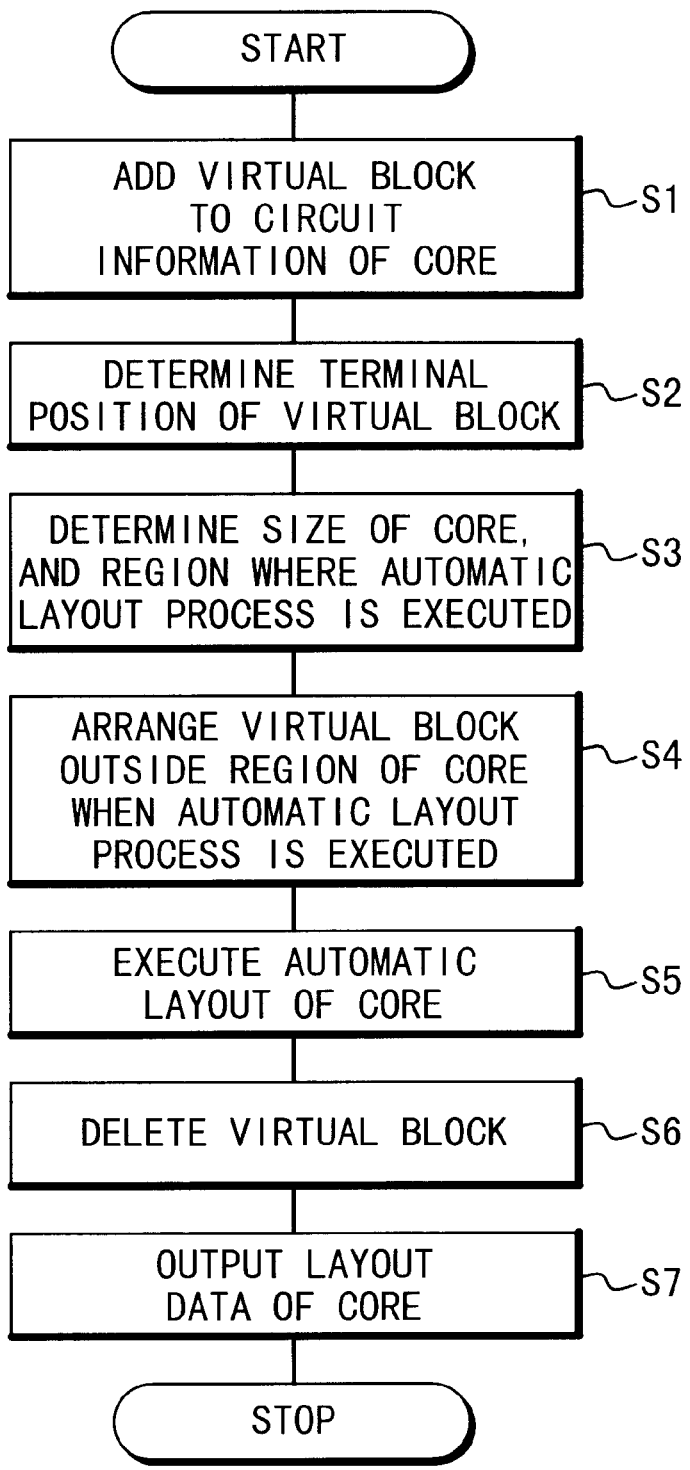
FIG. 8 is a flow chart for describing an automatic arranging and wiring method according to an embodiment of the present invention.
Figure 9A:
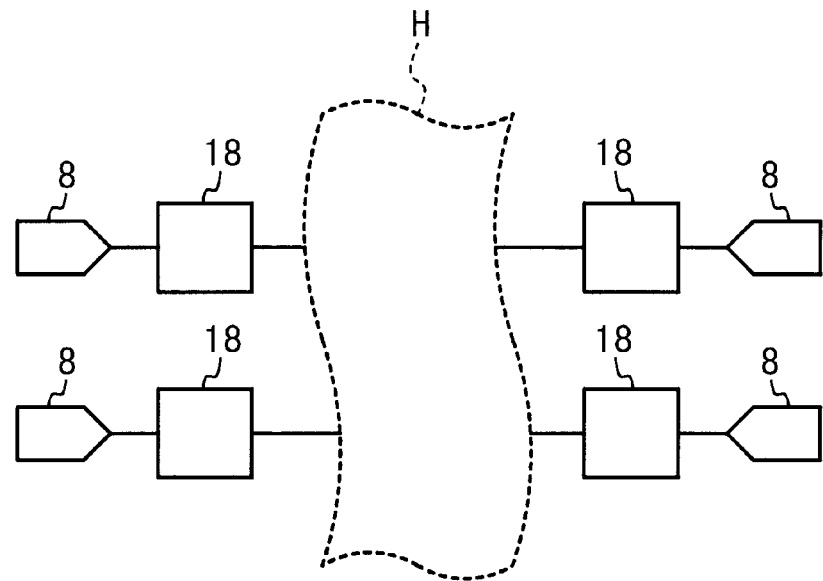
FIG. 9A is a schematic circuit diagram for indicating a subject circuit for the inventive automatic arranging and wiring method of FIG. 8.
Figure 9B:
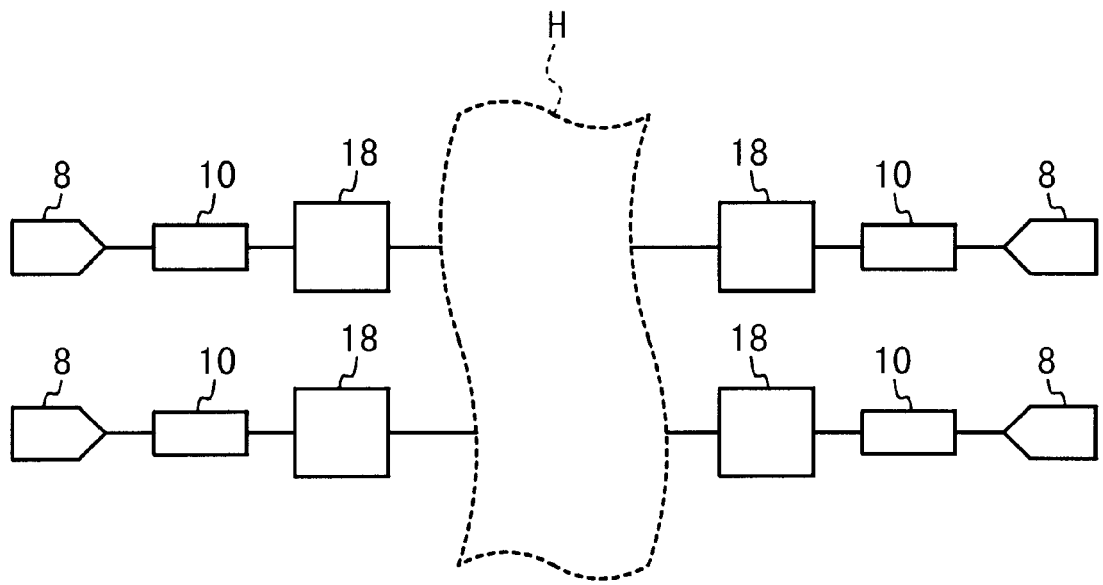
FIG. 9B is a circuit diagram formed by inserting a virtual block into the schematic circuit diagram shown in FIG. 9A.
Figure 10A:
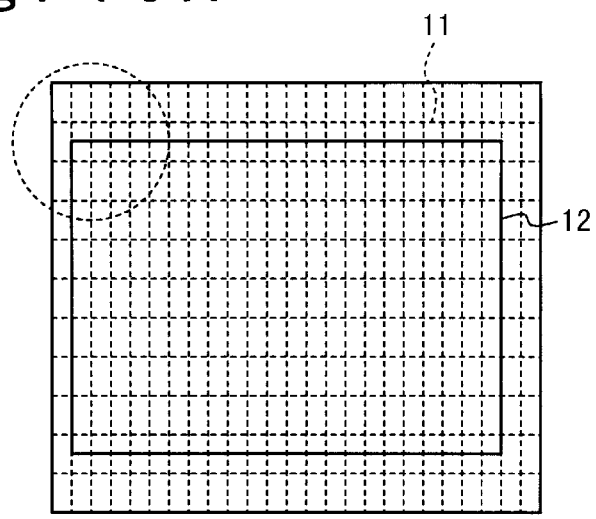
FIG. 10A is a plan view for representing setting of a boundary line of a core in accordance with the embodiment of FIG. 8.

FIG. 8 is a flow chart for describing an automatic arranging and wiring method according to a first preferred embodiment of the present invention. FIG. 9A is a schematic circuit diagram for indicating a subject circuit for this first automatic arranging and wiring method of FIG. 8, and FIG. 9B is a circuit diagram formed by inserting a virtual block into the schematic circuit diagram shown in FIG. 9A. Furthermore, FIG. 10A, FIG. 10B, and FIG. 11 are plan views for indicating layout structures formed by the automatic arranging and wiring method of this first embodiment, similar to FIG. 2A, FIG. 2B, and FIG. 3.

As previously explained, it should be understood in this specification that function blocks are called as "hardware-based cores", or "cores", and these function blocks are arranged in a semiconductor device such as a gate array.

Referring now to FIG. 9A and 9B, a virtual block 10 is interposed between an external terminal 8 outside a core and a function cell (a interface function cell) 18 to be an interface of the core, at a first step S1 of FIG. 8. The resulting circuit is shown in FIG. 9B. In FIG. 9A and 9B, symbol "H" indicated by a broken line denotes a group of function cells arranged inside a boundary line 12 (see FIG. 10A) of the core except for the plurality of interface function cells 18.

Figure 10B:
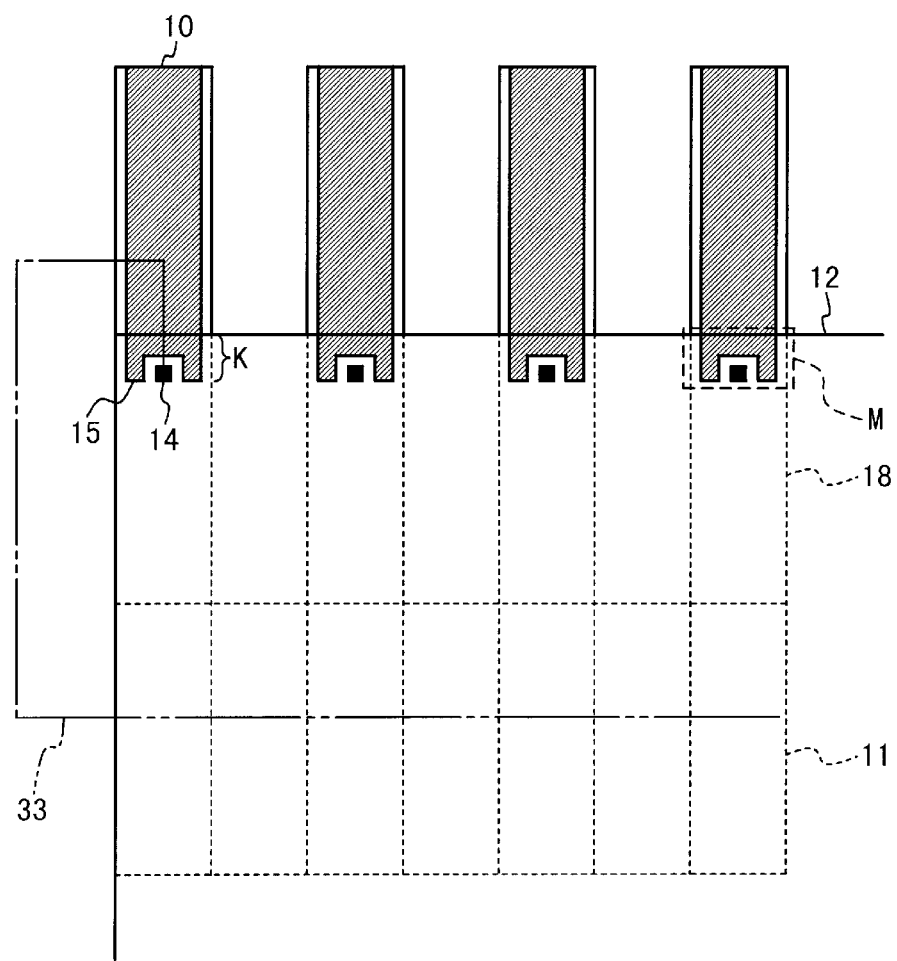
FIG. 10B is an enlarged plan view for showing the vicinity of the boundary line (inside circle) of the core indicated in FIG. 10A.
Figure 11:
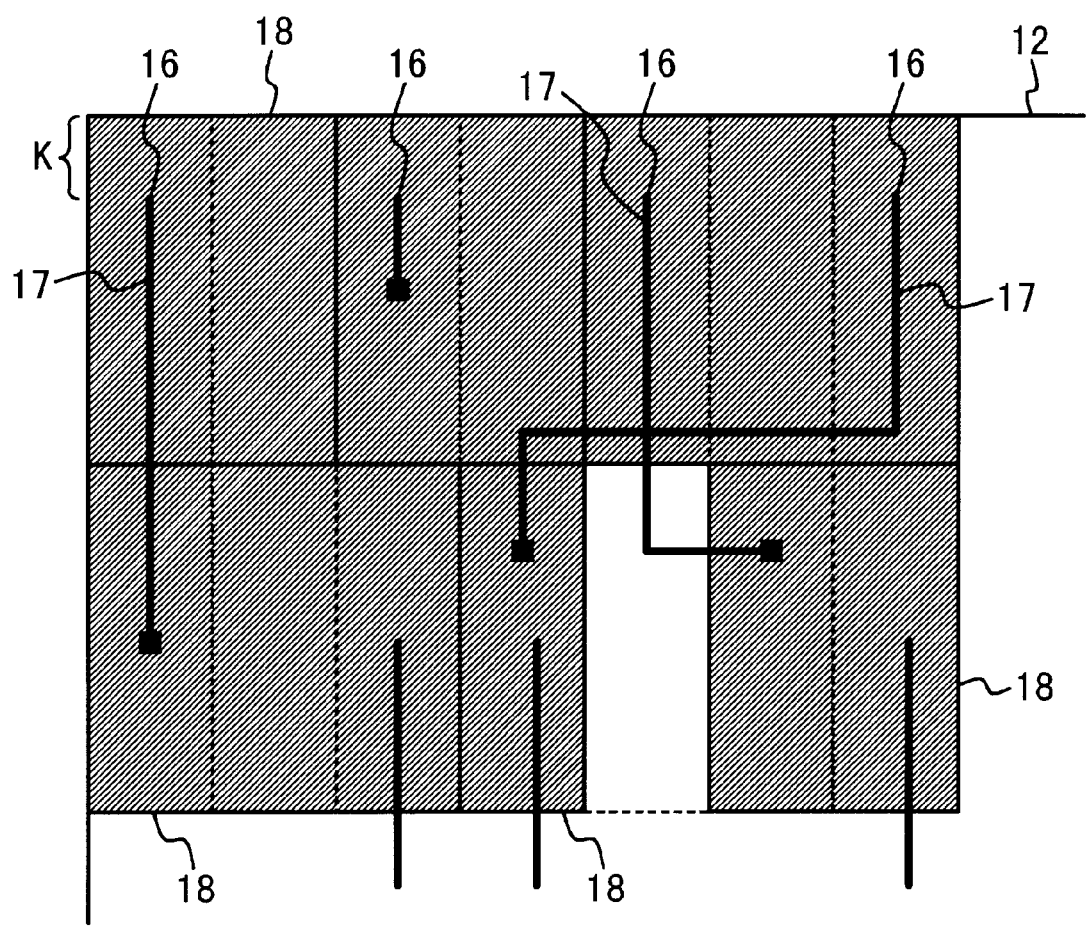
FIG. 11 is a plan view for representing core arranging and wiring patterns formed by the arranging and wiring method according to the embodiment of FIG. 8.

At a next step S2, a position of a terminal 14 provided with the virtual block 10 is set to a position (namely, edge portion of the virtual block 10) located adjacent to a boundary line of the virtual block 10 close to the interface function cell 18, inside the virtual block 10 (see FIG. 10B). A size of the virtual block 10 is defined based upon a dimension of a single cell equal to a minimum unit of the core. The virtual block 10 is arranged such that the terminal 14 of the virtual block 10 overlaps with the interface function cell 18. A region where the virtual block 10 overlaps with the interface function cell 18 is indicated by symbol "M" in FIG. 10B.

It should also be noted that the region M where the virtual block 10 overlaps with the interface function cell 18, corresponds to an area required for the terminal 14 to be arranged. The dimension of this region M is equal to, for example, 1 and 10 to 1 and 15 of a dimension of a single cell of the core (namely, dimension of the virtual block 10).

At a step S3, an optimum size of the core is determined based upon a circuit scale of the core, and the boundary line 12 which marks a region for an automatic layout is set at a predetermined position in the semiconductor device.

Next, at a step S4, the virtual block 10 is arranged outside the boundary line 12, and at a position located adjacent to the boundary line 12 of the core.

In this case, a portion of the virtual block 10 containing the terminal 14 is set such that the portion exceeds the boundary line 12 and is extended into the region of the core. That is, as illustrated in FIG. 10B, the virtual block 10 also involves the region in which the terminal 14 is arranged under the boundary line 12, and the virtual block 10 overlaps with the interface function cell 18.

At a next step S5, an automatic arranging and wiring operation of the core is performed by utilizing an automatic arranging and wiring program in which the condition defined at the step S4 is entered. In this case, the condition to be entered involves positional data related to the position where the virtual block 10 is arranged, and also the position of the terminal 14.

In this case, since a wiring layer which is not used by the core is utilized as a wiring layer used for the terminal 14 of the virtual block 10, there is no risk that this wiring layer used for the terminal 14 is shortcircuited with an internal wiring line (pattern) 17 of the core.

Moreover, in order to prevent a part of a wiring line 33 to connect to the terminal 14 from being arranged outside the boundary line 12 while executing the automatic wiring operation, a wiring prohibition region 15 is provided. The connection of a wiring line to the terminal 14 is prohibited in the wiring prohibition region 15. The wiring prohibition region 15 is provided to allow a wiring line for connecting to the terminal 14 to connect to the terminal 14 from substantially only one direction of an omnidirectional direction outside the terminal 14.

The wiring prohibition region 15 is provided in the virtual block 10 to surround the major portion of the periphery of the terminal 14. As shown in FIG. 10B, the wiring prohibition region 15 is set to all of portions in the virtual block 10, which are located outside the boundary line 12.

In a portion arranged inside the virtual block 10 from the boundary line 12 (namely, a portion overlapped with the interface function cell 18), this wiring prohibition region 15 is formed in a U-shape to surround the major portion of the periphery of the terminal 14, as shown in FIG. 10B. The wiring prohibition region 15 has a substantially U-shaped contour, and is opened along one direction of an omnidirectional direction outside the terminal 14.

This wiring prohibition region 15 may be set in the form of a library as to each of technologies, such that this wiring prohibition region need not be set every time a core is designed.

At a step S6, data about the virtual block 10 is deleted from the automatic arranging and wiring result of the core formed at the step S5.

Next, at a step S7, data produced by deleting the virtual block 10 from the automatic arranging and wiring result formed at the step S6 is outputted as layout data of the core as indicated in FIG. 11.

As a consequence, a position where the terminal 14 of the virtual block 10 was present before the virtual block 10 is deleted becomes a terminal 16 of the core. Also, the internal wiring line 17 is connected between this terminal 16 and the interface function cell 18. As a consequence, no confirmation is made whether or not a wiring line region "K" (see FIG. 10B and 11) used to arrange wiring lines (external wiring lines, not shown in detail) connected to external circuits outside the core is reserved between the boundary line 12 and all of the terminals 16.

In other words, no confirmation is made whether or not the interference between the external wiring lines and the internal wiring lines 17 is occurred in the wiring line region K. Since the U-shaped wiring prohibition region 15 is provided, there is no risk that the wiring lines other than the external wiring lines are connected to the terminal 16. In other words, since the wiring prohibition region 15 is formed, the internal wiring line 17 is arranged only on the lower side (namely, opposite side from boundary line 12) from the terminal 16.

Figure 6:
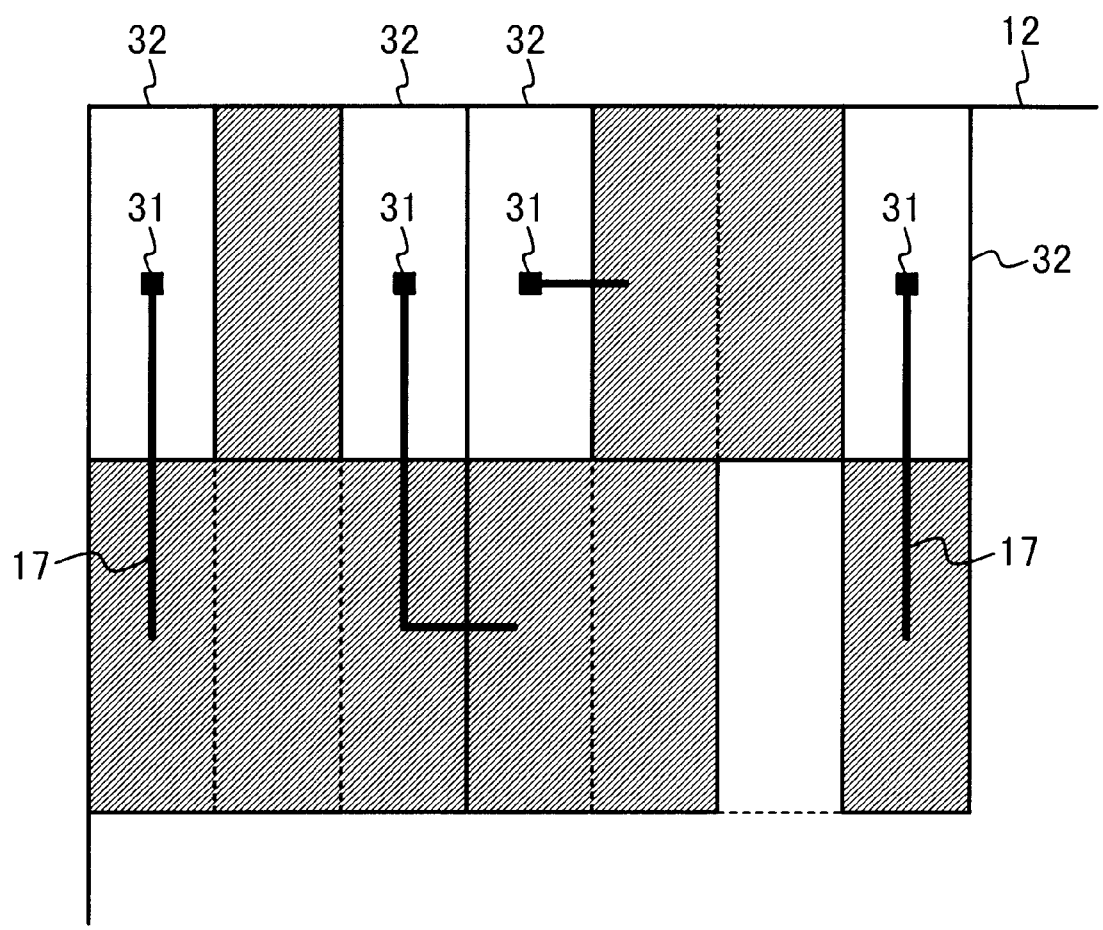
FIG. 6 is a plan view for representing the core arranging and wiring patterns formed by the conventional arranging and wiring method as the related art 2.
Figure 7A:
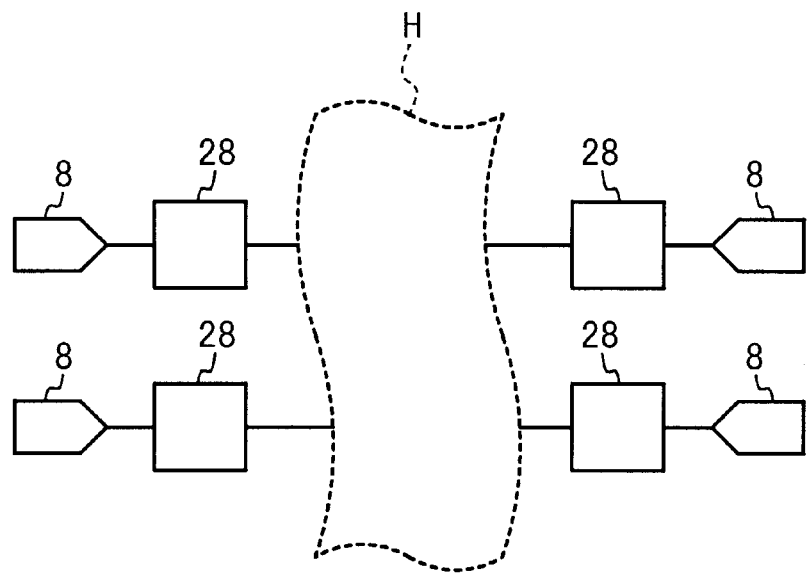
FIG. 7A is a schematic circuit diagram for indicating a subject circuit for the conventional automatic arranging and wiring method of FIG. 4.
Figure 7B:
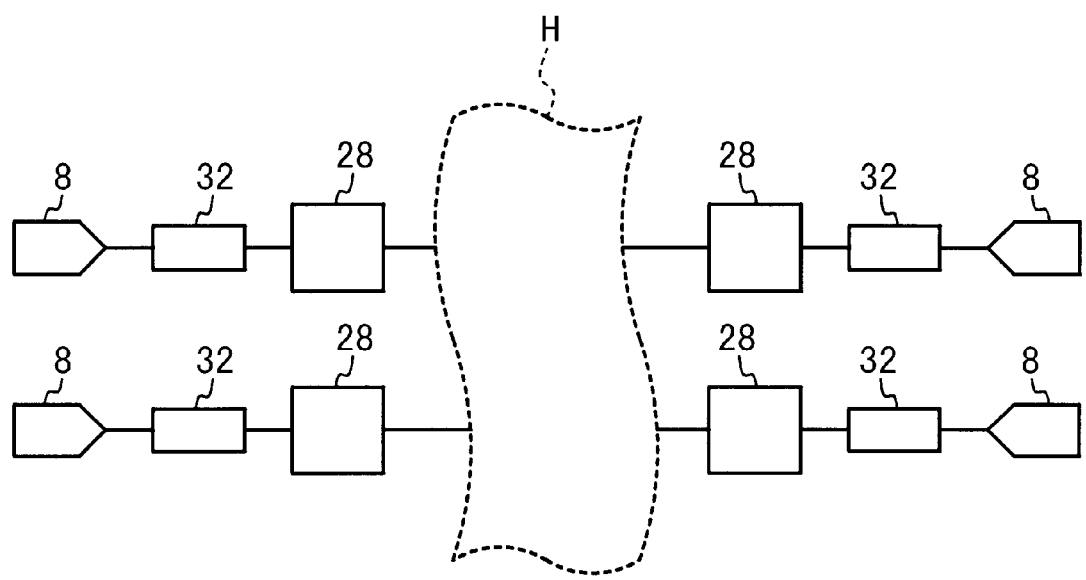
FIG. 7B is a circuit diagram formed by inserting a virtual block into the schematic circuit diagram shown in FIG. 7A.

In the above-mentioned related art 2, as shown in FIG. 6, a region (namely, dimension of single cell equal to minimum unit of the core) of the virtual block 32 must be formed in the region of the core. And a total number of a plurality of the regions is equal to a total number of the terminals 31. In this case, when the circuit scale is selected to be on the order of 1 K GATE and also a total number of the terminals 31 is selected to be 100 in the core, the area of the core is increased by approximately 10%. However, in the first embodiment, since the virtual block is essentially arranged outside the core and furthermore the virtual block is deleted after the automatic arranging and wiring operation of the core has been performed, there is no risk that the area of the core is not increased.

When the terminal 14 of the virtual block 10 is arranged, the terminal 14 is arranged in the vicinity of the boundary line 12 under the condition that a positional relationship between the terminal 14 and the boundary line 12 is established. As a consequence, the circuit arrangement defined from the terminal 14 to the boundary line 12 can be readily arranged in the automatic layout method, since the positional relationship between the terminal 14 of the interface function cell 18 and the boundary line 12 is known, and furthermore the terminal 14 is located near the boundary line 12.

Also, since the wiring prohibition region 15 is set to surround the terminal 14 of the virtual block 10, the internal wiring line (pattern) 17 is formed to be extended from the terminals 14 along the lower direction, as shown in FIG. 10B and 11. As a result, the step of checking whether or not the interference occurs between the external wiring lines and the internal wiring lines 17, is not required.

In the embodiment, the virtual block 10 is located adjacent to the boundary line 12 of the core, or is extended (overlapped) into a small region inside the core while jumping over the boundary line 12 of the core. Then, the terminal 14 used to be connected with the external wiring lines, is arranged inside the core. After that, the automatic arranging and wiring operation of the core is performed by using the computer.

Accordingly, since the terminal 14 of the core is arranged adjacent to the boundary line 12 of this core, no confirmation is made to check whether or not interference occurs between the terminal 14 and the external wiring lines, and therefore, the efficiency of the layout design can be increased.

Also, since the virtual block is deleted after the automatic arranging and wiring operation of the core has been completed, there is no risk that the integration degree of the semiconductor device is not deteriorated.

While the present invention has been described with reference to the preferred embodiments, the method of automatically arranging and wiring patterns of a semiconductor device according to the present invention is not limited only to the above-explained embodiments, but may be modified, changed, or substituted without departing from the technical scope and spirit of the present invention.

As previously described in detail, in accordance with the method of automatically arranging and wiring patterns of a semiconductor device of the present invention, the step of confirming whether or not interference occurs between the external wiring lines outside the core and the internal wiring lines is no longer required. Furthermore, the occupied area of the core is not increased. As a consequence, the method of automatically arranging and wiring patterns of a semiconductor device which can effectively design the semiconductor device with the high integration degree can be provided.

What is claimed is:

1. A method of producing a core for a semiconductor device, comprising the steps of:

setting a boundary line of said core;

providing a virtual block, said virtual block being positioned at least partly outside said core;

setting a contact to said virtual block, said contact being used to be connected to an external wiring line of external circuit outside said core;

arranging said virtual bock such that said contact is arranged inside boundary line and on a position adjacent to said boundary line; and automatically arranging and wiring said core containing said contact to produce layout data of said core, said layout data including executing an automatic arranging and wiring operation of said core such that said internal wiring line does not pass through a region provided between said boundary line and said contact.

2. A method of producing said core according to claim 1, wherein said step of setting said contact includes setting said contact in an edge portion of said virtual block.

3. A method of producing said core according to claim 1, wherein said step of providing said virtual block includes providing said virtual block to have a dimension equal to that of a single cell corresponding to a minimum unit of a function cell for constituting said core.

4. A method of producing said core according to claim 1, further comprising the step of:

deleting data corresponding to said virtual block from said layout data to produce arranging and wiring data of said core.

5. A method of producing said core according to claim 1, wherein said step of producing said layout data includes executing an automatic arranging and wiring operation of said core based upon circuit data indicative of a circuit specification of said semiconductor device, and said circuit data contains data indicative of said virtual block.

6. A method of producing said core according to claim 5, wherein said circuit data contains data indicating that said virtual block has a dimension of a single cell corresponding to a minimum unit of a function cell for constituting said core.

7. A method of producing a core for a semiconductor device, comprising the step of:

setting a boundary line of said core;

providing a virtual block, which has a contact to be connected to an external wiring line of an external circuit outside said core, said virtual block being positioned at least partly outside said core;

setting a wiring prohibition region in said virtual block, connection of an internal wiring line arranged inside said core to said contact being prohibited in said wiring prohibition region, said wiring prohibition region to have a substantially U-shaped contour and opened along one direction of an omnidirectional direction outside said contact; and arranging said virtual block such that said contact is arranged inside said boundary line, and on a position adjacent to said boundary line.

8. A semiconductor device producing apparatus for producing a core for a semiconductor device, comprising:

means for setting a boundary line of said core;

means for providing a virtual block, said virtual block being positioned at least partly outside said core;

means for setting a contact to said virtual block, wherein said contact is used to be connected to an external wiring line of an external circuit outside said core;

means for arranging said virtual block such that said contact is arranged inside said boundary line and on a position adjacent to said boundary line; and means for automatically arranging and wiring said core containing said contact to produce layout data of said core, wherein said means for producing said layout data executes an automatic arranging and wiring operation of said core such that an internal wiring line arranged inside said core does not pass through a region provided between said boundary line and said contact.

9. A semiconductor device producing apparatus according to claim 8, wherein said means for setting said contact sets said contact in an edge portion of said virtual block.

10. A semiconductor device producing apparatus according to claim 8, wherein said means for providing said virtual block provides said virtual block to have a dimension equal to that of a single cell corresponding to a minimum unit of a function cell for constituting said core.

11. A semiconductor device producing apparatus according to claim 8, further comprising:

means for deleting data corresponding to said virtual block from said layout data to produce arranging and wiring data of said core.

12. A semiconductor device producing apparatus according to claim 8, wherein said means for producing said layout data executes an automatic arranging and wiring operation of said core based upon circuit data indicative of a circuit specification of said semiconductor device, and said circuit data contains data indicative of said virtual block.

13. A semiconductor device producing apparatus according to claim 12, wherein said circuit data contains data indicating that said virtual block has a dimension equal to that of a single cell corresponding to a minimum unit of a function cell for constituting said core.

14. A semiconductor device producing apparatus according to claim 8, wherein said means for arranging said virtual block arranges said virtual block on a position corresponding to an external contact formed in said external circuit and used to be connected with said contact.

15. A semiconductor device producing apparatus according to claim 8, wherein said means for arranging said virtual block arranges said virtual block between an external contact formed in said external circuit and used to be connected with said contact, and a function cell to be an interface of said core as a part of said core.

16. A semiconductor device producing apparatus for producing a core for a semiconductor device, comprising:

means for setting a boundary line of said core;

means for providing a virtual block, which has a contact to be connected to an external wiring line of an external circuit outside said core, said virtual bock being positioned at least partly outside said core;

means for setting a wiring prohibition region in said virtual bock connection of an internal wiring line arranged said core to said contact being prohibited in said wiring prohibition region;

means for arranging said virtual block such that said contact is arranged inside said boundary line and on a position adjacent to said boundary line; and wherein said means for setting said wiring prohibition region sets said wiring prohibition region to have a substantially U-shaped contour, and to be opened along one direction of an omnidirectional direction outside said contact.

17. A method of producing a core for a semiconductor device, comprising the steps of:

providing a virtual block, which has a contact to be connected to an external wiring line of an external circuit outside said core;

setting a wiring prohibition region in said virtual block, connection of an internal wiring line arranged inside said core to said contact being prohibited in said wiring prohibition region; and arranging at least said contact of said virtual block inside said core;

wherein said setting step includes setting said wiring prohibition region to have a substantially U-shaped contour, and to be opened along one direction of an omnidirectional direction outside said contact.

18. A method of producing said core according to claim 17, further comprising the step of:

automatically arranging and wiring said core containing said contact to produce layout data of said core.

19. A method of producing said core according to claim 18, further comprising the step of:

deleting data corresponding to said virtual block from said layout data to produce arranging and wiring data of said core.

20. A method of producing said core according to claim 18, wherein said step of producing said layout data includes executing an automatic arranging and wiring operation of said core based upon circuit data indicative of a circuit specification of said semiconductor device, and said circuit data contains data indicative of said virtual block.

21. A method of producing said core according to claim 18, wherein said step of producing said layout data includes executing an automatic arranging and wiring operation of said core such that said internal wiring line does not pass through said wiring prohibition region.

22. A semiconductor device producing apparatus for producing a core for a semiconductor device, comprising:

means for providing a virtual block, which has a contact to be connected to an external wiring line of an external circuit outside said core;

means for setting a wiring prohibition region in said virtual block, connection of an internal wiring line arranged inside said core to said contact being prohibited in said wiring prohibition region; and means for arranging at least said contact of said virtual block inside said core;

wherein said setting step includes setting said wiring prohibition region to have a substantially U-shaped contour, and to be opened along one direction of an omnidirectional direction outside said contact.

23. A semiconductor device producing apparatus according to claim 22, further comprising:

means for automatically arranging and wiring said core containing said contact to produce layout data of said core.

24. A semiconductor device producing apparatus according to claim 23, further comprising:

means for deleting data corresponding to said virtual block from said layout data to produce arranging and wiring data of said core.

25. A semiconductor device producing apparatus according to claim 23, wherein said means for producing said layout data executes an automatic arranging and wiring operation of said core based upon circuit data indicative of a circuit specification of said semiconductor device, and said circuit data contains data indicative of said virtual block.

26. A semiconductor device producing apparatus according to claim 23, wherein said means for producing said layout data executes an automatic arranging and wiring operation such that said internal wiring line does not pass through said wiring prohibition region.

27. A semiconductor device producing apparatus according to claim 22, wherein said means for arranging said virtual block arranges said virtual block on a position corresponding to an external contact formed in said external circuit and used to be connected with said contact.

28. A semiconductor device producing apparatus according to claim 22, wherein said means for arranging said virtual block arranges said virtual block between an external contact formed in said external circuit and used to be connected with said contact, and a function cell to be an interface of said core as a part of said core.

* * * * *